(12) United States Patent
Adams et al.

(10) Patent No.: US 7,622,912 B1
(45) Date of Patent: Nov. 24, 2009

(54) METHOD FOR ENABLING MONITORING OF POWER CONSUMPTION

(75) Inventors: Frank J. Adams, Los Altos, CA (US); David L. Klein, Palo Alto, CA (US)

(73) Assignee: Sunpower Corporation, San Jose, CA (US)

( * ) Notice: Subject to any disclaimer, the term of this patent is extended or adjusted under 35 U.S.C. 154(b) by 0 days.

(21) Appl. No.: 12/136,698

(22) Filed: Jun. 10, 2008

(51) Int. Cl.
  *G01R 31/28* (2006.01)
(52) U.S. Cl. .................. 324/158.1; 324/142; 324/107; 324/117 H; 307/44; 307/45; 307/64
(58) Field of Classification Search ................ 324/142, 324/158.1, 107, 117 H; 307/43, 44, 45
See application file for complete search history.

(56) References Cited

U.S. PATENT DOCUMENTS

| | | | |
|---|---|---|---|
| 3,986,115 A * | 10/1976 | Huang | 324/102 |
| 4,486,706 A * | 12/1984 | Kobayashi | 324/133 |
| 4,763,014 A * | 8/1988 | Model et al. | 307/66 |
| 4,788,493 A * | 11/1988 | Liptak | 324/140 R |
| 5,181,026 A | 1/1993 | Granville | |
| 5,473,244 A * | 12/1995 | Libove et al. | 324/126 |
| 2006/0085167 A1 | 4/2006 | Warfield et al. | |

OTHER PUBLICATIONS

Rocoil, "How Do Rogowski Coils Work?" downloaded May 2008, 3 pp.
Wikipedia, "Rogowski Coil," downloaded May 2008, 1 pp.
Dent Instruments, Inc., "Application Note—Optimizing Performance from Rogowski Coil CTs," downloaded May 2008, 2 pp.
Dooley, Michael et al., "Method and Apparatus for Monitoring Energy Consumption of a Customer Structure," U.S. Appl. No. 11/699,934, filed Jan. 30, 2008, 22 pp.
Klein, David L et al., "Localized Power Point Optimizer for Solar Cell Installations," U.S. Appl. No. 11/731,455, filed Mar. 30, 2007, 25 pp.

* cited by examiner

*Primary Examiner*—Ha Tran T Nguyen
*Assistant Examiner*—Richard Isla Rodas
(74) *Attorney, Agent, or Firm*—James F. Hann; Haynes Beffel & Wolfeld LLP

(57) ABSTRACT

Power consumption at a site is monitored. An electrical load is connected to a power source by an electrical conductor. A fuel-less energy producing device is electrically connected to a junction along the electrical conductor. A current sensor is electromagnetically coupled to the electrical conductor at a sensing position between the power source and the junction to create a current sensor signal. Sensed current and voltage signals are produced from the current sensor signal. A sensed phase relationship between the sensed signals is determined and compared to a baseline phase relationship to determine the direction of current flow through the conductor. A power source signal, based on the current flowing through the conductor at the sensing position, is created. With some examples a Rogowski type differential current sensor is used. In some examples a single current sensor is used.

15 Claims, 5 Drawing Sheets

METHOD FOR ENABLING MONITORING OF POWER CONSUMPTION

FEDERALLY SPONSORED RESEARCH OR DEVELOPMENT

This invention was made with Government support under DE-FC36-07GO17043 awarded by DOE. The Government has certain rights in this invention.

CROSS REFERENCE TO OTHER APPLICATIONS

This application is related to U.S. patent application Ser. No. 11/699,934, filed 30 Jan. 2008, entitled Method and Apparatus for Monitoring Energy Consumption of a Customer Structure.

BACKGROUND OF THE INVENTION

This invention relates to monitoring of energy use at a site, such as a home or a commercial building, which obtains power from both (1) a solar, wind or other fuel-less power source, and (2) another power source, typically a utility power source.

It is useful to have information on current electrical energy consumption in a building, be it commercial or residential, obtaining energy from a fuel-less power source, typically solar panels. The information about the electrical energy produced by solar panels is commonly readily available through standard interface protocols from the electronic systems within the inverter used to convert the DC energy into useful AC energy. However, the corresponding information is typically not readily available from the utility company's metering components.

BRIEF SUMMARY OF THE INVENTION

A method for enabling monitoring of power consumption at a site, the site comprising an electrical load connected to a power source through a junction, the power source connected to the junction by an electrical conductor and a fuel-less energy producing device electrically connected to the junction, is carried out as follows. A current sensor is electromagnetically coupled to the electrical conductor at a sensing position between the power source and the junction without direct electrical connection to the electrical conductor to create a current sensor signal. A sensed current signal and a sensed voltage signal are produced from the current sensor signal. A sensed phase relationship between the sensed voltage signal and the sensed current signal is determined. The sensed phase relationship is compared to a baseline phase relationship to determine the direction of current flow through the conductor. A power source signal, based on the direction and magnitude of current flowing through the conductor at the sensing position, is created. With some examples the electromagnetically coupling step is carried out using a Rogowski type differential current sensor. In some examples the electromagnetically coupling step is carried out using a single current sensor.

Other features, aspects and advantages of the present invention can be seen on review of the figures, the detailed description, and the claims which follow.

DESCRIPTION OF THE SPECIFIC EMBODIMENTS

Figure 1:
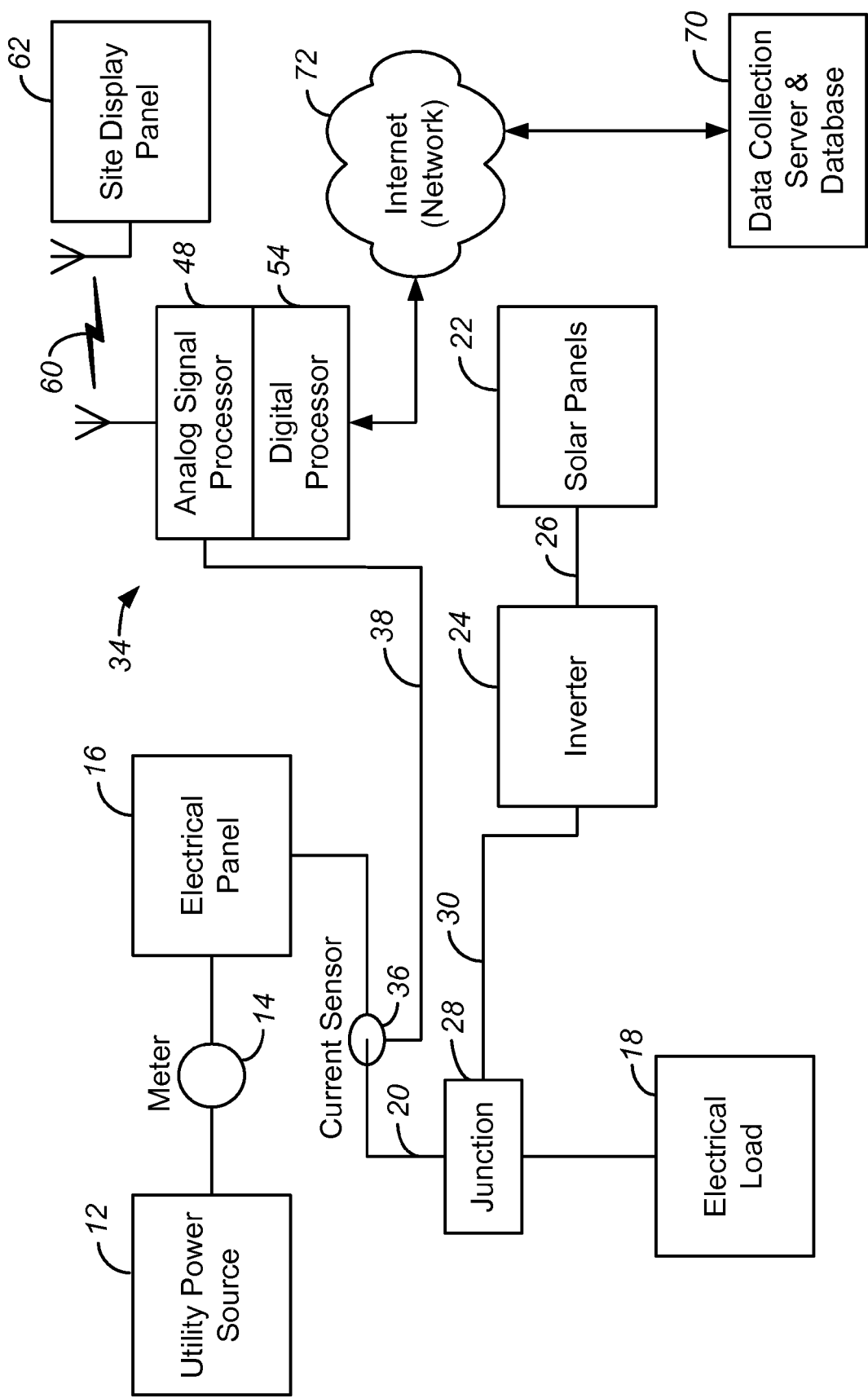
FIG. 1 is a schematic diagram illustrating a system for enabling monitoring of power consumption at a site.

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

The invention is described with reference to solar panel installations. However, the invention can also be used with other types of fuel-less energy producing devices, such as wind powered energy machines and water powered energy machines.

One aspect of the invention is the recognition that it would be put extremely useful to provide current, effectively real-time monitoring of power consumption at an installation site with information on the amount of power being generated by solar panels, the amount of power being used at the installation site and the amount of power being provided by or sent to the utility or other sources of power. Another aspect of the invention is the recognition that for many installations it is not currently practical to determine the amount of power being supplied by or to the power source using a direct electrical connection to the electrical conductor from the power source. The present invention is constructed so that there is no direct electrical connection to the electrical conductor from power source permitting the invention to be of particular value when used as part of a retrofit procedure with, for example, existing utility grid-connected solar power installations. An advantage of the invention is that a single sensing device can be used to detect both current and voltage.

FIG. 1 illustrates a simplified block diagram of a system 10 including a power source 12 connected to an electric consumption meter 14 at a site, such as an individual house, a commercial building, or other location at which solar electric power is generated. Although power source 12 is typically a utility power source, it could also be a local power source such as a fossil fuel powered generator. Meter 14 is typically connected to an electrical panel 16. Electrical power is supplied from electrical panel 16 to the electrical load 18 at the site by electrical conductor 20. Solar panels 22 are connected to an inverter 24 by a line 26, with inverter 24 connected to a junction 28 along electrical conductor 20 by a line 30. The above described structure is generally conventional.

In this application the current from power source 12 and from inverter 24 is taken to be sinusoidal and at the same nominal voltage, typically 120 V. However, the invention can also be practiced using other types of alternating current and other voltages.

Figure 2:
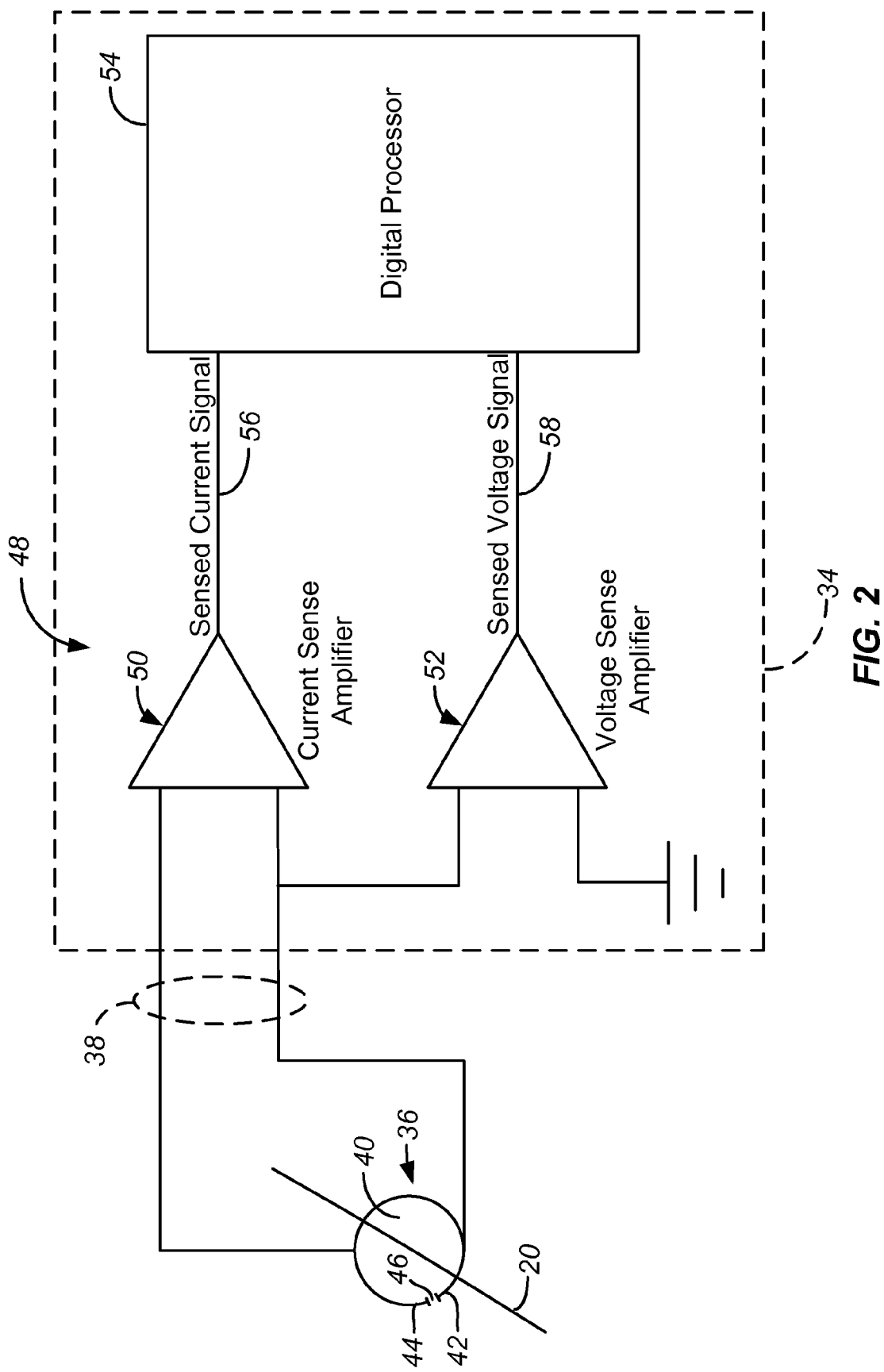
FIG. 2 is a simplified schematic diagram of the current sensor and signal conditioning circuit of FIG. 1.

System 10 also includes a signal conditioning circuit 34 connected to a current sensor 36 by a current sensor signal line 38. Current sensor 36 is positioned along electrical conductor 20 between junction 28 and electrical panel 16 and is electromagnetically coupled to electrical conductor 20 without direct electrical connection to the electrical conductor. Current sensor 36 is, in one example, a differential noncontact current sensor, such as a Rogowski coil having an open interior 40, see FIG. 2, and generally opposed ends 42, 44 defining a gap 46 therebetween. Using this type of non-contact current sensor provides several advantages. It makes retrofit operation simple because the original wiring need not be interrupted or changed; the electrical conductor can be simply inserted through the gap without disturbing the conductor. The measurement error from a typical Rogowski coil is small, such as about 1%, which is acceptable for the present purposes of providing the user with a reasonably accurate measurement of, for example, power consumption and solar power generation. Other types of non-contact current sensors, such as other differential sensors or proportional sensors, including magnetic field current sensors, current transformers, and Hall effect sensors, can also be used.

The passage of current having a changing amplitude, such as alternating current, in conductor 20 induces a current sensor signal in line 38 corresponding to the rate of change of the current in conductor 20. This current sensor signal in line 38 is transmitted to the analog signal processor 48 of signal conditioning circuit 34. Analog signal processor 48 includes a current sense amplifier 50 and a voltage sense amplifier 52 connected to line 38. Signal conditioning circuit 34 also includes a digital processor 54 connected to amplifiers 50, 52 by lines 56, 58. Amplifiers 50, 52 provide digital processor 54 with an analog sensed current signal on line 56 and an analog sensed voltage signal on line 58.

Digital processor 54 takes the sensed analog current and voltage signals on lines 56 and 58, digitizes them, and determines their amplitudes and their phase differences to determine a sensed phase relationship. This sensed phase relationship is compared to a baseline phase relationship. The baseline phase relationship is determined by determining the amplitudes of and any phase differences between the sensed current and voltage signals on lines 56 and 58 when the direction of current through electrical conductor between electrical panel 16 and a junction 28 is known. This is most typically accomplished when solar panels 22 are not producing any electricity, such as at night, or by disconnecting line 30 from junction 28 so that any current passing through electrical conductor 20 to junction 28 is from electrical panel 16. This can be done once, at unspecified intervals, or periodically, such as once a day or once a week or once a month. Digital processor 54 also receives information from inverter 24 on the flow of current from solar panels 22; this transfer of information, which is not indicated in FIG. 1, can be through a hardwired connection or a remote connection, or a combination of both.

The phase shift from a differential sensor, such as a Rogowski coil, is different from the phase shift from a proportional sensor, such as a current transformer. For both types of sensors the sensed voltage signal on line 58 will lag the actual voltage waveform on conductor 20 by 90 degrees. The reason for this is that sensor 36 is capacitively coupled to conductor 20. The sensed current signal on line 56 for a proportional sensor, such as a current transformer, will be in phase with the actual current flowing in conductor 20, but its readout may be 0 or 180 degrees from the current depending on the way in which the sensor is installed. This installation ambiguity can be resolved by taking a reading at the time when current from power source 12 is higher than from solar panels 22. The sensed current signal on line 56 for a differential sensor (e.g. a Rogowski coil) will lag current by 90 degrees. As with a proportional sensor, there is also an installation ambiguity effect which results in the system reporting either 90 or 270 degrees of phase shift depending on which direction the sensor is installed.

Figure 4A:
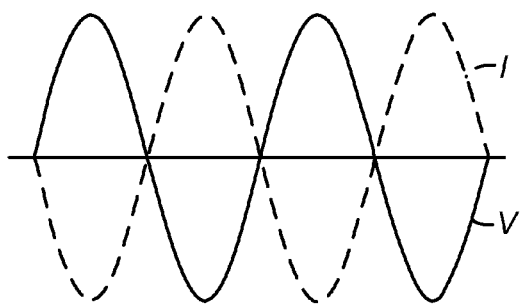
FIGS. 4A and 4B are examples of phase diagrams for a differential current sensor showing the current and voltage signals 180° out of phase in FIG. 4A and in phase in FIG. 4B depending on the orientation of the sensor installed on the electrical conductor.
Figure 7A:
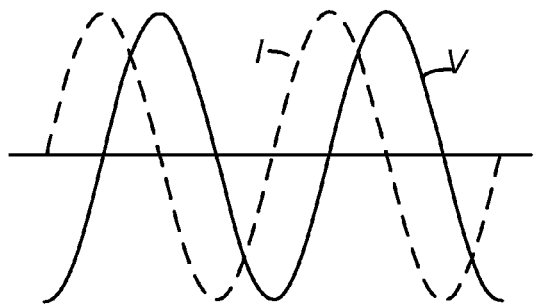
FIGS. 7A and 7B are examples of phase diagrams for a proportional current sensor showing the current lagging voltage by 90° in FIG. 7A and current leading voltage by 90° in FIG. 7B depending upon the orientation of the sensor installed on the electrical conductor.
Figure 7B:
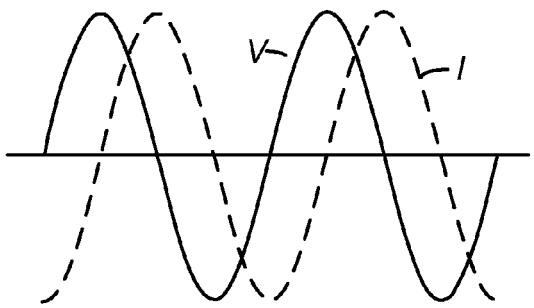

The net effect is that when a differential sensor (e.g. a Rogowski coil) is used as sensor 36, both the sensed voltage signal on line 58 and the sensed current signal on line 56 have a 90 degree phase shift and so they will be in phase with each other, or shifted by 180 degrees, depending on how the sensor 36 was installed, when the current from the utility or other power source 12 is greater than the current from solar panels 22. This is illustrated in FIGS. 4A (180° out of phase) and 4B (in phase). However when a proportional sensor such as a current transformer is used, there will 90 degree difference between the sensed voltage signal on line 58 and the sensed current signal on line 56. This is illustrated in FIGS. 7A and 7B with current lagging voltage by 90° in FIG. 7A and current leading voltage by 90° in FIG. 7B.

In a practical application, there will be some incidental phase shift from filtering and amplifiers, but these phase shifts will not be significant, typically at most about 20°. In addition, the above description is for an installation with an ideal (resistive) load factor. In a real world installation, there will typically be some inductive nature to the load from, for example, induction motors on a refrigerator. Such a load factor will often create a 10-20 degree phase shift which is typically called a power factor. These relatively small phase shifts can be and will be ignored for purposes of this application.

Figure 4B:
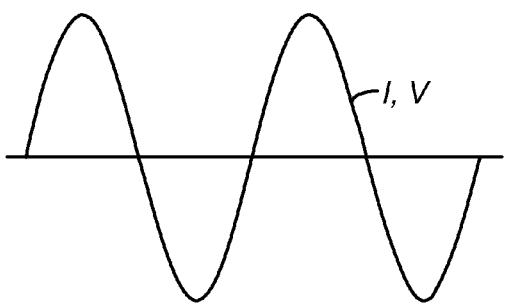
Figure 5A:
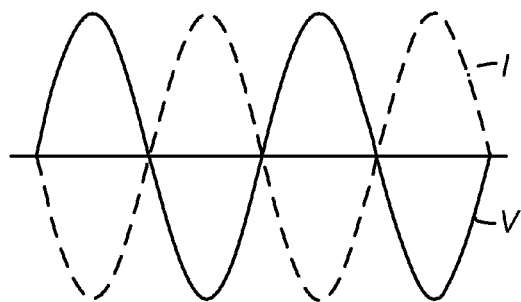
FIGS. 5A and 5B illustrate the phase relationships for the current and voltage signals for the differential current sensor installations of FIGS. 4A and 4B, respectively, when current is passing into the load from both the power source and the solar panels.
Figure 5B:
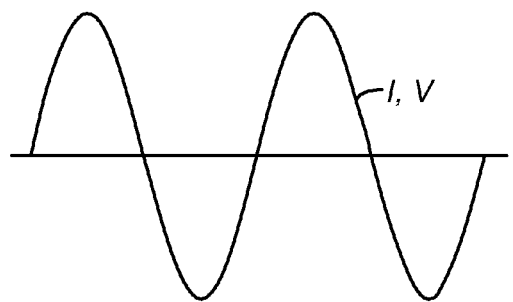

FIGS. 5A and 5B illustrate the phase relationships for the current and voltage signals for the current sensor installations of FIGS. 4A and 4B respectively taken at, for example, 10 a.m., at which time current is passing into load 18 from both power source 12 and solar panels 22. While there may be a small phase shift from the corresponding phase relationships of FIGS. 4A and 4B, signal conditioning circuit 34 interprets the lack of a significant phase shift as a determination that the current passing between electrical panel 16 and junction 28 is flowing from power source 22 to junction 28 and on to electrical load 18. That is, assuming solar panels 22 are producing electricity, the electric current supplied to load 18 is being supplied by both power source 12 and solar panels 22.

Figure 6A:
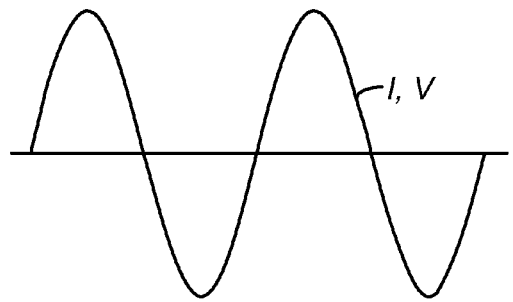
FIGS. 6A and 6B correspond to the differential current sensor installations of FIGS. 4A and 4B, respectively, showing the voltage and current taken when the current from the solar panels is greater than that required by the electrical load.
Figure 6B:
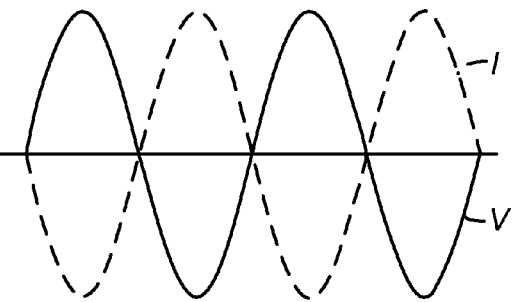

FIGS. 6A and 6B correspond to the differential current sensor installations of FIGS. 4A and 4B, respectively, showing the voltage and current measurements taken at 2 p.m. when the current from solar panels 22, and thus through line 30, is greater than that required by electrical load 18. By the shift in the phase relationships between the current and voltage signals, signal conditioning circuit 34 can simply and accurately identify that the current passing through current sensor 36 is passing into power source 12.

Figure 8A:
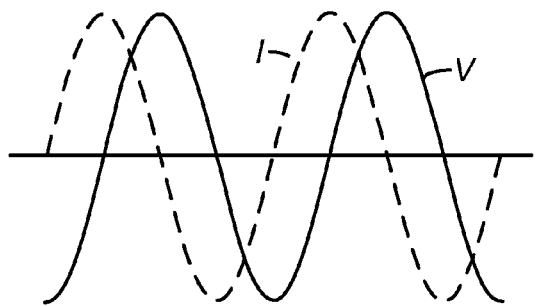
FIGS. 8A and 8B illustrate the phase relationships for the current and voltage signals for the proportional current sensor installations of FIGS. 7A and 7B, respectively, taken when current is passing into the electrical load from both the power source and the solar panels.
Figure 8B:
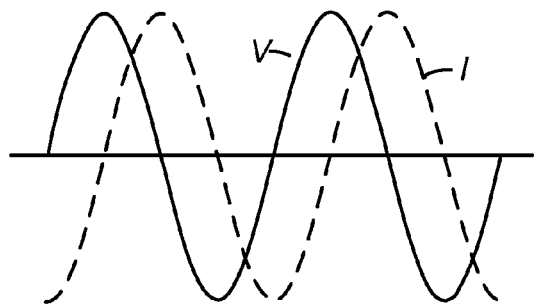

FIGS. 8A and 8B illustrate the phase relationships for the current and voltage signals for the proportional current sensor installations of FIGS. 7A and 7B respectively taken at, for example, 10 a.m., at which time current is passing into load 18 from both power source 12 and solar panels 22. While there may be a small phase shift from the corresponding phase relationships of FIGS. 7A and 7B, signal conditioning circuit 34 interprets the lack of a significant phase shift as a determination that the current passing between electrical panel 16 and junction 28 is flowing from power source 22 to junction 28 and on to electrical load 18. That is, assuming solar panels 22 are producing electricity, the electric current supplied to load 18 is being supplied by both power source 12 and solar panels 22.

Figure 9A:
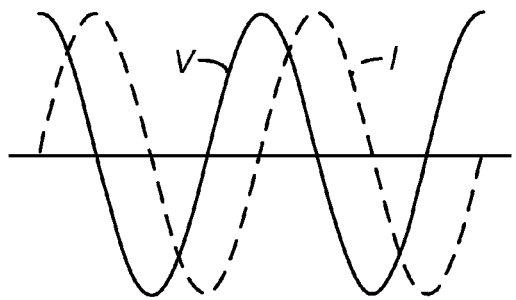
FIGS. 9A and 9B, which correspond to the proportional sensor installations of FIGS. 7A and 7B, show that current leads voltage by 90° in FIG. 9A and current lags voltage by 90° in FIG. 9B when the current from the solar panels 22 is greater than that required by the electrical load.
Figure 9B:
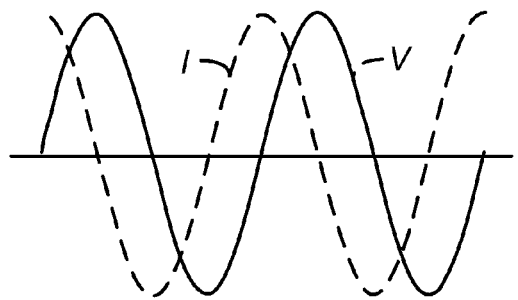

FIGS. 9A and 9B, which correspond to the sensor installations of FIGS. 7A and 7B, show that current leads voltage by 90° in FIG. 9A and current lags voltage by 90° in FIG. 9B. These voltage and current measurements are taken at, for example, 2 p.m. when the current from solar panels 22, and thus through line 30, is greater than that required by electrical load 18. By the shift in the phase relationships between the current and voltage signals from the corresponding signals in FIGS. 7A and 7B, signal conditioning circuit 34 can simply and accurately identify that the current passing through current sensor 36 is passing into power source 12.

Figure 3:
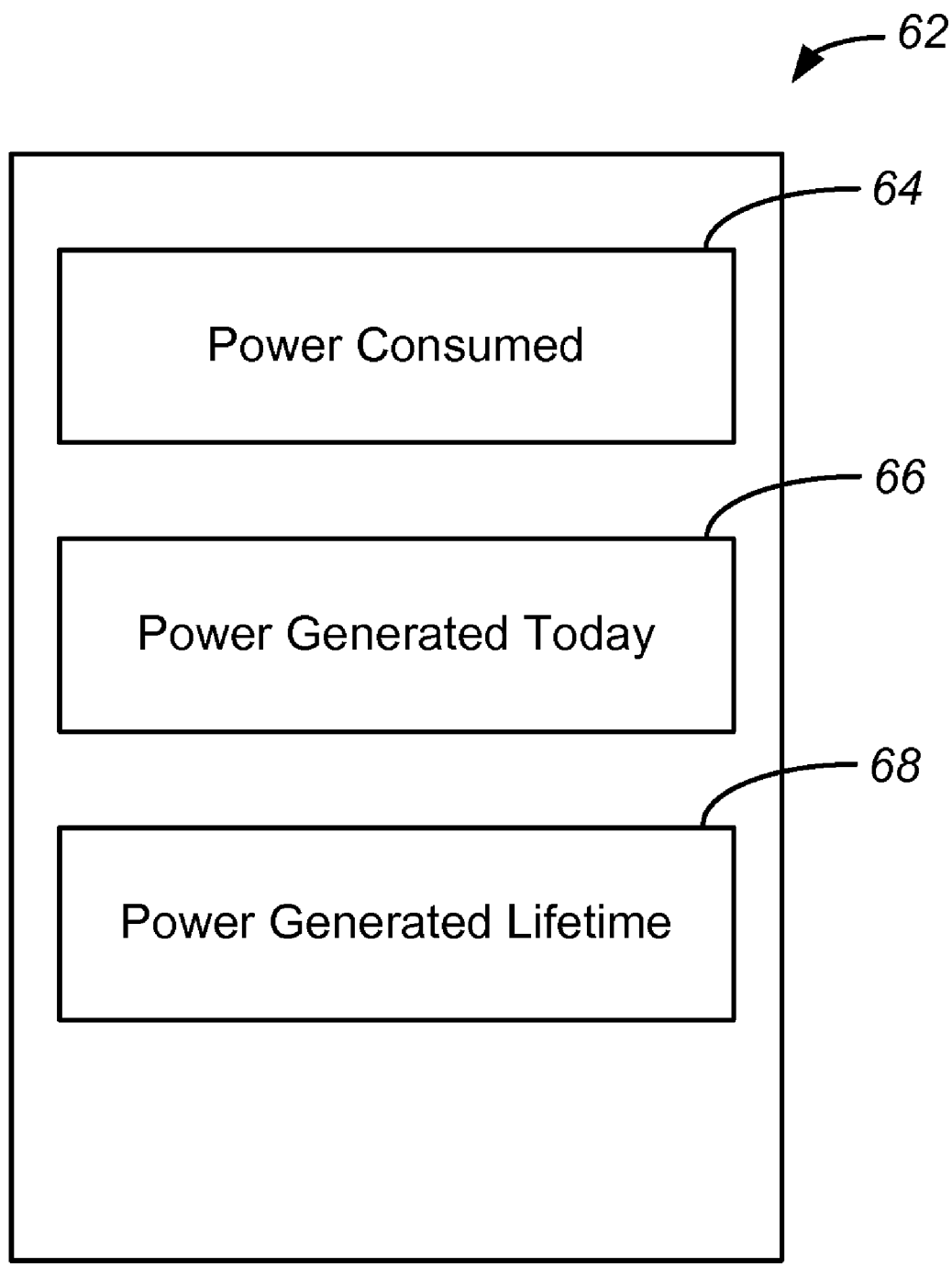
FIG. 3 is a simplified view of an example of the site display panel of FIG. 1.

Digital processor 54 takes all this information and transmits a signal 60 to a site display panel 62, also called a visual display, shown in FIG. 3. Signal 60 provides site display panel 62 with information to permit various operational parameters to be displayed by panel 62. In the example of FIG. 3, display panel 62 has an energy consumed display 64, which displays the total amount of energy consumed by electrical load 18 for a period of time, such as a day, a week or a month, an energy generate display 66 to display the energy generated by solar panels 22 during a period of time, such as the current day, and an energy generated lifetime display 68 to display a running total of the amount of energy generated by solar panels 22.

FIG. 1 also suggests the optional coupling of digital processor 54 to a data collection server and database 70 over the Internet or other network 72. Processor 54 transfers energy consumption data to data collection server and database 70, which collects and analyzes the energy consumption data to calculate the energy balance, that is whether the site is a net consumer or a net producer of energy, and then transmits this information back to the user at the site. A number of companies provide this type of service, including Fat Spaniel Technologies, Inc. of San Jose, Calif.; Fronius USA LLC of Brighton, Mich.; and SunPower Corporation of San Jose, Calif.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are incorporated by reference.

What is claimed is:

1. A method for enabling monitoring of power consumption at a site, the site comprising an electrical load connected to a power source through a junction, the power source connected to the junction by an electrical conductor, a fuel-less energy producing device electrically connected to the junction, the method comprising:
    electromagnetically coupling a current sensor to the electrical conductor at a sensing position between the power source and the junction without direct electrical connection to the electrical conductor to create a current sensor signal;
    producing from the current sensor signal a sensed current signal and a sensed voltage signal;
    determining a sensed phase relationship between the sensed voltage signal and the sensed current signal;
    comparing the sensed phase relationship to a baseline phase relationship to determine the direction of current flow through the conductor; and
    creating a power source signal based on to the direction and magnitude of current flowing through the conductor at the sensing position.

2. The method according to claim 1 wherein the electromagnetically coupling step comprises:
    placing a flexible Rogowski coil, having an open interior and generally opposed ends, in a mounting state with the opposed ends defining a gap therebetween in the mounting state; and
    surrounding the electrical conductor with the flexible Rogowski coil by passing the electrical conductor through the gap and into the interior.

3. The method according to claim 1 further comprising determining the baseline phase relationship by carrying out steps corresponding to the electromagnetically coupling, producing and determining steps when the direction of current flow through the conductor at said sensing position is known.

4. The method according to claim 3 wherein the baseline phase relationship determining step is carried out when there is effectively no current flowing from the fuel-less energy producing device.

5. The method according to claim 1 further comprising updating the baseline phase relationship.

6. The method according to claim 5 wherein the updating step is carried out by carrying out steps corresponding to the electromagnetically coupling, producing and determining steps when the direction of current flow through the conductor is known.

7. The method according to claim 5 wherein the updating step is carried out automatically.

8. The method according to claim 1 further comprising:
    generating a fuel-less energy producing device current signal corresponding to the current passing from the fuel-less energy producing device;
    using the fuel-less energy producing device current signal and the power source current signal to create a power use signal; and
    providing the power use signal to a device at the site.

9. The method according to claim 8 wherein the providing step comprises transmitting the power use signal to a visual display device at the site, and further comprising displaying power use parameters on the visual display, the power use parameters derived from the power use signal.

10. The method according to claim 9 wherein the power use parameters displaying step comprises displaying values representative of (1) the power consumed during a time period, (2) the power generated by the fuel-less energy producing device during a time the time period, and (3) the total power generated by the fuel-less energy producing device.

11. The method according to claim 1 wherein the electromagnetically coupling step is carried out using a single current sensor.

12. The method according to claim 1 wherein the electromagnetically coupling step is carried out using a proportional current sensor.

13. The method according to claim 1 wherein the electromagnetically coupling step is carried out using a differential current sensor.

14. A method for enabling monitoring of power consumption at a site, the site comprising an electrical load connected to a power source through a junction, the power source connected to the junction by an electrical conductor, a solar panel electrically connected to the junction through an inverter, the method comprising:

electromagnetically coupling a single current sensor to the electrical conductor at a sensing position between the power source and the junction without direct electrical connection to the electrical conductor to create a current sensor signal;

producing from the current sensor signal a sensed current signal and a sensed voltage signal;

determining a sensed phase relationship between the sensed voltage signal and the sensed current signal;

comparing the sensed phase relationship to a baseline phase relationship to determine the direction of current flow through the conductor; and creating a power source signal based on the direction and magnitude of current flowing through the conductor at the sensing position.

15. The method according to claim 14 further comprising:

generating a solar panel current signal corresponding to the current passing from the solar panel and through the inverter;

using the solar panel current signal and the power source current signal to create a power use signal; and providing the power use signal to a device at a site.

* * * * *